(12) United States Patent
Miyazawa

(10) Patent No.: US 10,400,736 B2
(45) Date of Patent: Sep. 3, 2019

(54) SEMICONDUCTOR DEVICE

(71) Applicant: FUJI ELECTRIC CO., LTD., Kawasaki-shi, Kanagawa (JP)

(72) Inventor: Shigemi Miyazawa, Matsumoto (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 121 days.

(21) Appl. No.: 15/800,918

(22) Filed: Nov. 1, 2017

(65) Prior Publication Data
US 2018/0128234 A1    May 10, 2018

(30) Foreign Application Priority Data

Nov. 9, 2016   (JP) .................................. 2016-219262

(51) Int. Cl.
*F02P 3/00* (2006.01)
*F02P 3/05* (2006.01)
*F02P 3/055* (2006.01)
*H03K 3/57* (2006.01)

(52) U.S. Cl.
CPC ............. *F02P 3/051* (2013.01); *F02P 3/0552* (2013.01); *H03K 3/57* (2013.01)

(58) Field of Classification Search
CPC ............ F02P 3/57; F02P 3/0552; H03K 3/051
See application file for complete search history.

(56) References Cited

U.S. PATENT DOCUMENTS

| 5,970,964 A * | 10/1999 | Furuhata ............... F02P 3/0552 123/644 |
| 10,008,835 B2 * | 6/2018 | Miyazawa ............ H01L 27/088 |
| 2006/0022609 A1 * | 2/2006 | Yukutake .............. F02P 3/0552 315/209 T |
| 2006/0244496 A1 * | 11/2006 | Kawakita .............. F02P 3/0552 327/110 |
| 2009/0289670 A1 | 11/2009 | Toyoda et al. |
| 2012/0033341 A1 * | 2/2012 | Miyazawa .............. F23Q 3/004 361/253 |
| 2013/0241609 A1 * | 9/2013 | Miyazawa ............... H03K 3/57 327/142 |
| 2014/0375385 A1 * | 12/2014 | Miyazawa ............ H03F 1/0211 330/253 |

(Continued)

FOREIGN PATENT DOCUMENTS

JP    2009-284420 A    12/2009

*Primary Examiner* — Hieu T Vo
*Assistant Examiner* — Sherman D Manley
(74) *Attorney, Agent, or Firm* — Rabin & Berdo, P.C.

(57) ABSTRACT

A semiconductor device includes a power semiconductor element that is connected between a first terminal on a high potential side and a second terminal on a low potential side and that is controlled to be on or off corresponding to a gate potential, a turn-off condition detector that detects whether a control signal input from a control terminal and controlling the power semiconductor element satisfies a predetermined turn-off condition, a first switching element that controls the gate potential of the power semiconductor element to be an off-potential when the turn-off condition detector detects that the turn-off condition is satisfied, and a detector for a collector current of the power semiconductor element. The turn-off condition detector uses the control signal and the collector current as the turn-off condition.

6 Claims, 7 Drawing Sheets

(56) References Cited

U.S. PATENT DOCUMENTS

2015/0263491 A1\* 9/2015 Miyazawa .............. H01T 15/00
                                                                        315/209 T
2017/0045025 A1\* 2/2017 Nakayama .............. F02P 3/051

\* cited by examiner

SEMICONDUCTOR DEVICE

CROSS REFERENCE TO RELATED APPLICATIONS

This application is based upon and claims the benefit of priority of the prior Japanese Patent Application No. 2016-219262, filed on Nov. 9, 2016, the entire contents of which are incorporated herein by reference.

BACKGROUND OF THE INVENTION

1. Field of the Invention

Embodiments of the present invention relate to a semiconductor device.

2. Description of the Related Art

A power semiconductor device handling high electric power is conventionally known as a semiconductor device that is used for ignition of an internal combustion engine or the like (see, e.g., Japanese Laid-Open Patent Publication No. 2009-284420). It is desirable for the circuit that drives this power semiconductor device to be able to prevent a malfunction in which the power semiconductor device is set to be in an off-state despite the circuit receiving a signal to set the power semiconductor device to be in an on-state, the malfunction occurring because a potential difference is generated between the reference potential of the circuit and the reference potential of a control signal generator.

SUMMARY OF THE INVENTION

According to one embodiment of the present invention, a semiconductor device includes a power semiconductor element connected between a first terminal on a high potential side and a second terminal on a low potential side, the power semiconductor element controlled to turn on or off corresponding to a gate potential; a current detector configured to detect a collector current value of the power semiconductor element; a turn-off condition detector configured to detect whether a control signal input from a control terminal and controlling the power semiconductor element satisfies a predetermined turn-off condition; and a first switching element configured to control the gate potential of the power semiconductor element to be an off-potential when the turn-off condition detector detects that the turn-off condition is satisfied. The turn-off condition detector includes an input terminal connected to the current detector and uses the control signal and the collector current value as the turn-off condition.

In the embodiment, the turn-off condition detector includes a detector configured to detect whether the control signal exceeds a predetermined threshold; and an inverter configured to output a first switching element control signal to control the first switching element according to a detection result obtained by the detector.

In the embodiment, the first switching element electrically connects a gate and an emitter of the power semiconductor element to each other to set the gate of the power semiconductor element to be at an off-potential.

According to the embodiment, the semiconductor device further includes a second gate controller configured to control the gate current of the power semiconductor element, according to the collector current of the power semiconductor element.

In the embodiment, the power semiconductor element is one of an IGBT and a vertical MOSFET.

In the embodiment, the semiconductor device is an igniter configured to control, according to an external control signal, current flowing through an ignition coil.

Objects, features, and advantages of the present invention are specifically set forth in or will become apparent from the following detailed description of the invention when read in conjunction with the accompanying drawings.

DETAILED DESCRIPTION OF THE INVENTION

First, problems associated with the conventional techniques will be described. The driving circuit of a power semiconductor device however may malfunction and cause ignition at an abnormal timing, resulting in a defect or the like in an internal combustion engine, etc. connected to the driving circuit. It is desirable for the driving circuit to have a function of preventing turn-off of the power semiconductor device when an on-signal is input.

Figure 5:
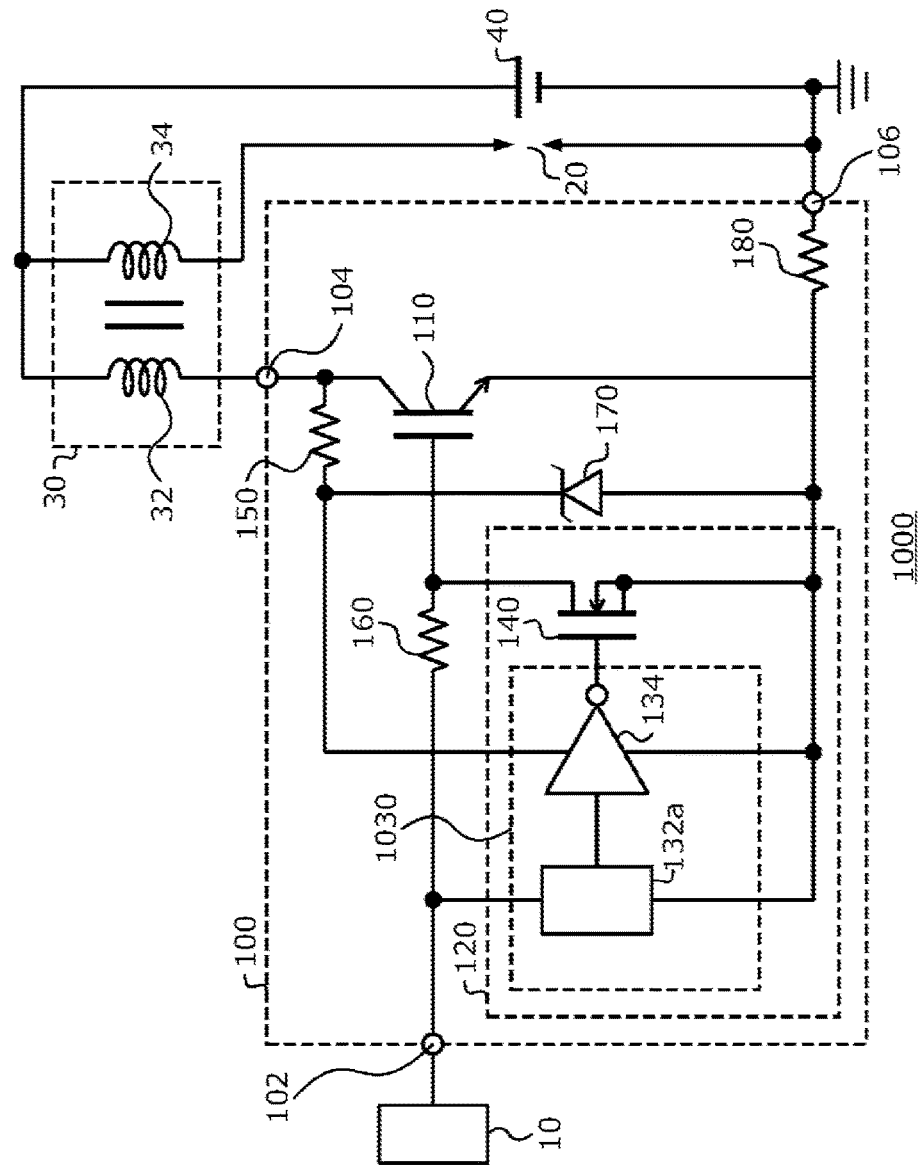
FIG. 5 is a diagram of an example of a configuration of an igniter according to a conventional technique.

FIG. 5 is a diagram of an example of the configuration of an igniter 1000 according to a conventional technique. The igniter 1000 ignites a spark plug used in an internal combustion engine or the like of an automobile or the like. An example will be described where the igniter 1000 is mounted on an engine of an automobile. The igniter 1000 includes a control signal generator 10, a spark plug 20, an ignition coil 30, a power source 40, and a semiconductor device 100.

The control signal generator 10 generates a switching control signal to control the switching between on and off of the semiconductor device 100. The control signal generator 10 constitutes, for example, a portion or the overall unit of an engine control unit (ECU) of an automobile on which the igniter 1000 is equipped. The control signal generator 10 supplies the generated control signal to the semiconductor device 100. The control signal generator 10 supplies the control signal to the semiconductor device 100 and the igniter 1000 and thereby starts an ignition operation for the spark plug 20.

The spark plug 20 electrically generates a spark by discharge. The spark plug 20 discharges when voltage equal to or higher than, for example, 20 kV is applied. For example, the spark plug 20 is provided in an internal combustion engine and in this case, ignites a combustion gas such as an air-fuel mixture in a combustion chamber. For example, the spark plug 20 is provided in a through hole that penetrates from an exterior of a cylinder to the combustion chamber inside the cylinder and is fixed to seal the through hole. In this case, first end of the spark plug 20 is exposed in the combustion chamber and the second end thereof receives an electrical signal from an external source outside the cylinder.

The ignition coil 30 supplies an electrical signal to the spark plug 20. The ignition coil 30 supplies, as the electrical signal, a high voltage to cause the spark plug 20 to discharge. The ignition coil 30 may function as a transformer and is, for example, an ignition coil that includes a primary coil 32 and a secondary coil 34. A first end of the primary coil 32 and a first end of the secondary coil 34 are electrically connected to each other. The number of turns of the primary coil 32 is smaller than that of the secondary coil 34, and the primary coil 32 and the secondary coil 34 share a core with each other. The secondary coil 34 generates an electromotive force (a mutual induction electromotive force) corresponding to the electromotive force generated in the primary coil 32. A second end of the secondary coil 34 is connected to the spark plug 20 and supplies the generated electromotive force to the spark plug 20 to cause discharge.

The power source 40 supplies a voltage to the ignition coil 30. For example, the power source 40 supplies a constant voltage Vb (e.g., 14 V) determined in advance, to the first ends of the primary coil 32 and the secondary coil 34. The power source 40 is a battery of an automobile, for example.

The semiconductor device 100 switches between conduction (on) and non-conduction (off), between the second end of the primary coil 32 of the ignition coil 30 and the reference potential according to a control signal supplied from the control signal generator 10. For example, the semiconductor device 100 causes the primary coil 32 and the reference potential to be conductive therebetween in response to the potential of the control signal being high (an on-potential), and causes the primary coil 32 and the reference potential to be non-conductive therebetween in response to the potential of the control signal being low (an off-potential).

The reference potential may be a reference potential in a control system of an automobile or may be a reference potential that corresponds to the semiconductor device 100 in the automobile. The reference potential may be a low potential that turns off the semiconductor device 100, and is 0 V, for example. The semiconductor device 100 includes a control terminal 102, a first terminal 104, a second terminal 106, a power semiconductor element 110, a first gate controller 120, a resistor 150, a resistor 160, a Zener diode 170, and a wire 180.

The control terminal 102 receives input of the control signal to control the power semiconductor element 110. The control terminal 102 is connected to the control signal generator 10 and receives the control signal. The first terminal 104 is connected to the power source 40 through the ignition coil 30. The second terminal 106 is connected to the reference potential. The first terminal 104 is a terminal on a high potential side as compared to the second terminal 106 and the second terminal 106 is a terminal on a low potential side as compared to the first terminal 104.

The gate potential of the power semiconductor element 110 is controlled according to the control signal. The power semiconductor element 110 includes a gate terminal (Gate), a collector terminal (Collector), and an emitter (Emitter) terminal, and electrically connects or disconnects the collector terminal and the emitter terminal to/from each other according to the control signal input into the gate terminal.

The power semiconductor element 110 is connected between the first terminal 104 on the high potential side and the second terminal 106 on the low potential side and is controlled to be turned on or off corresponding to the gate potential. The power semiconductor element 110 is an insulated gate bipolar transistor (IGBT), for example. The power semiconductor element 110 may be a metal oxide semiconductor field effect transistor (MOSFET).

The power semiconductor element 110 has a breakdown voltage reaching several hundred V, for example. The power semiconductor element 110 is, for example, a vertical device that has a collector electrode formed on a first surface side of a substrate, and a gate electrode and an emitter electrode formed on a second surface side of the substrate, opposite the first surface side. The power semiconductor element 110 may be a vertical MOSFET. For example, the emitter terminal of the power semiconductor element 110 is connected to the reference potential. The collector terminal is connected to the second end of the primary coil 32. In this example of the conventional technique, the power semiconductor element 110 will be described, for example of an n-channel IGBT that electrically connects the collector terminal and the emitter terminal to each other when the potential of the control signal becomes the on-potential.

The first gate controller 120 detects whether the control signal that is input from the control terminal 102 and controls the power semiconductor element 110 satisfies a predetermined turn-off condition, and controls the gate potential of the power semiconductor element 110. The first gate controller 120 includes a turn-off condition detector 1130 and a first switching element 140.

The first switching element 140 is connected between the gate terminal of the power semiconductor element 110 and the reference potential. The first switching element 140 is an FET that, for example, is controlled to be on or off between a drain terminal thereof and a source terminal thereof corresponding to the gate potential. The drain terminal of the first switching element 140 is connected to the gate terminal of the power semiconductor element 110 and the source terminal thereof is connected to the reference potential. The first switching element 140 switches whether the control signal input from the control terminal 102 is to be supplied to the gate terminal of the power semiconductor element 110.

In other words, the drain terminal of the first switching element 140 is connected to the gate terminal of the power semiconductor element 110, the source terminal of the first switching element 140 is connected to the emitter terminal of the power semiconductor element 110, and the first switching element 140 switches whether the gate of the power semiconductor element 110 is set to be at the off-potential by electrically connecting the gate terminal and the emitter terminal of the power semiconductor element 110 to each other. The first switching element 140 is a normally off switching element that, for example, electrically connects the drain terminal and the source terminal to each other when the potential of the gate terminal becomes high. In this case, the first switching element 140 may be an n-channel MOSFET.

The turn-off condition detector 1130 detects whether the control signal is input from the control terminal 102 and controls the power semiconductor element 110 based on a predetermined turn-off condition. The turn-off condition detector 1130 may detect whether the control signal satisfies the turn-off condition, using a predetermined threshold. The turn-off condition detector 1130 includes a detector 132a and a signal output unit 134.

The detector 132a detects whether the control signal exceeds the predetermined threshold. The detector 132a determines that the turn-off condition is satisfied when, for example, the control signal Vin to turn on the power semiconductor element 110 becomes lower than the threshold value Vthin (e.g., 2 V). The detector 132a supplies a result of the detection to the signal output unit 134.

The signal output unit 134 outputs a signal to control the first switching element 140 according to the result of the detection by the detector 132a. The signal output unit 134 outputs a control signal that turns on the first switching element 140 when the detection result indicates that the control signal satisfies the turn-off condition. The signal output unit 134 outputs a control signal that turns off the first switching element 140 when the detection result indicates that the control signal does not satisfy the turn-off condition.

The signal output unit 134 is an inverter, for example. The signal output unit 134 operates using an electrical signal input from the first terminal 104 as a power source, and inverts and outputs the result of the detection by the detector 132a. The signal output unit 134 is connected to the first switching element 140 and supplies the control signal to the first switching element 140. The first switching element 140 controls the gate potential of the power semiconductor element 110 to be at the off-potential when the turn-off condition detector 1130 detects that the turn-off condition is satisfied.

The resistor 150 is provided between the first terminal 104 and a power source terminal on the high potential side of the signal output unit 134, and supplies the electrical signal input from the first terminal 104, to the signal output unit 134 as the power source. The electrical signal input from the first terminal 104 is varied according to the on-state or the off-state of the power semiconductor element 110. The resistor 150 limits the current input from the first terminal 104 side into the signal output unit 134. For example, the resistor 150 operates as a protective resistor that reduces the value of the current input from the first terminal 104 side into the signal output unit 134 to be equal to or lower than a predetermined current value even when the collector voltage of the power semiconductor element 110 is increased to about 400 V.

The resistor 160 is connected between the control terminal 102 and the gate terminal of the power semiconductor element 110. When the first switching element 140 is in the off-state, the resistor 160 delivers the control signal to the gate terminal of the power semiconductor element 110. When the first switching element 140 is in the on-state and causes the control signal to flow to the reference potential, the resistor 160 reduces the voltage of the control signal. The reference potential is therefore supplied to the gate terminal of the power semiconductor element 110.

The Zener diode 170 is connected between the resistor 150 and the reference potential. The Zener diode 170 prevents voltage exceeding the rating of the signal output unit 134 from being input from the first terminal 104. For example, even when the collector voltage of the power semiconductor element 110 is increased to about 400 V, the Zener diode 170 clamps, at a voltage value determined in advance, the value of the voltage input from the first terminal 104 side into the signal output unit 134. The Zener diode 170 clamps the value of the voltage at about 6 V to about 16 V, for example.

The wire 180 is a bonding wire connecting a low voltage side electrode of the semiconductor device 100 to the second terminal.

As to the semiconductor device 100 according to the conventional technique, when the potential of the control signal becomes high, the power semiconductor element 110 is in the on-state. A collector current Ic, therefore, flows from the power source 40 through the primary coil 32 of the ignition coil 30. Temporal variation dIc/dt of the collector current Ic is determined corresponding to the inductance of the primary coil 32 and the supply voltage of the power source 40, and is increased to a predetermined (or preset) current value. For example, the collector current Ic is increased to about several A, about several tens of A, or about several tens of A.

When the potential of the control signal becomes low, the power semiconductor element 110 is in the off-state and the collector current rapidly decreases. Due to the rapid decrease of the collector current, the end-to-end voltage of the primary coil 32 rapidly increases due to the self-induced electromotive force and generates an induced electromotive force reaching about several tens of kV for the end-to-end voltage of the secondary coil 34. The igniter 1000 may cause the spark plug 20 to discharge and ignite the combustion gas, by supplying the voltage of the secondary coil 34 to the spark plug 20.

Figure 6A:
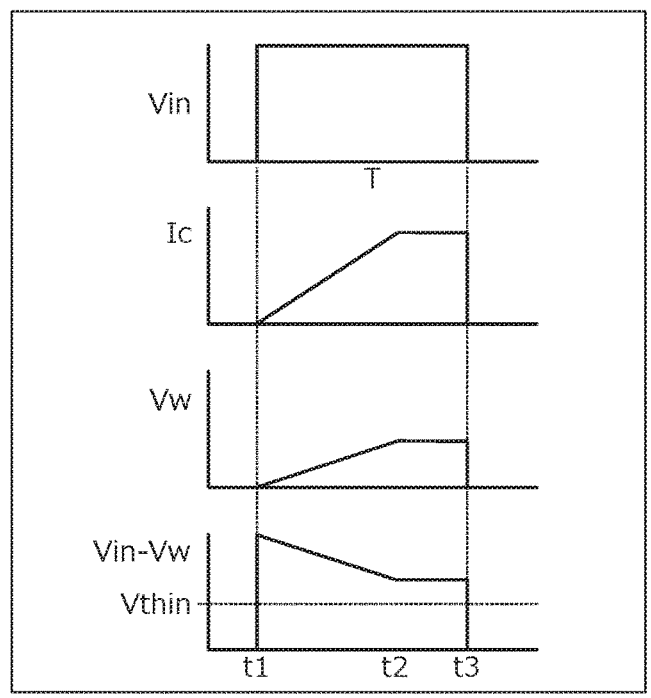
FIGS. 6A and 6B are diagrams of an example of operation waveforms of components of a semiconductor device according to the conventional technique.
Figure 6B:
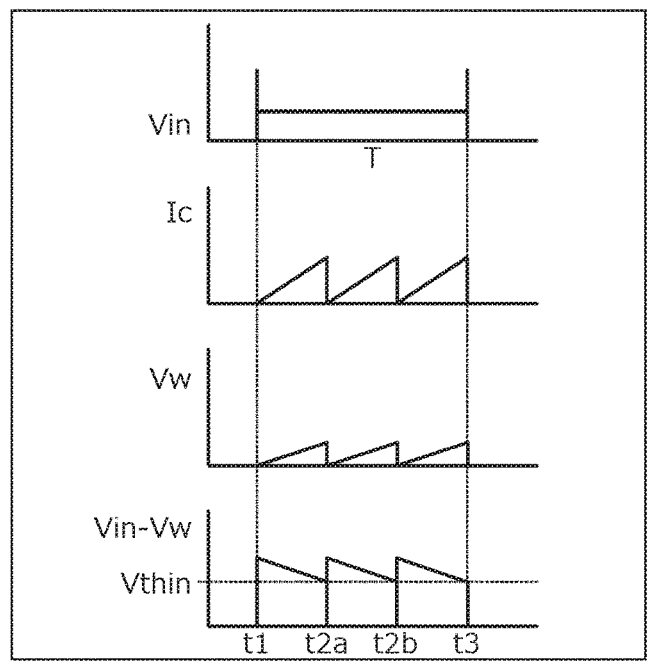

FIGS. 6A and 6B are diagrams of an example of operation waveforms of the components of the semiconductor device 100 according to the conventional technique. In FIGS. 6A and 6B, the axis of abscissa represents the time and the axis of ordinate represents the voltage value or the current value. Denoting the control signal input from the control terminal 102 as "Vin", the current between the collector and the emitter of the power semiconductor element 110 (referred to as "collector current") as "Ic", and the end-to-end voltage of the wire 180 as "Vw", each of FIGS. 6A and 6B depicts the temporal waveforms thereof.

FIG. 6A depicts an example where the control signal Vin input into the control terminal 102 rises from 0 V to a voltage that exceeds the threshold value Vthin of the detector 132a at a time t1 and thereafter, falls from the voltage that exceeds the threshold value Vthin to 0 V at a time t3.

In the example in FIG. 6A, the power semiconductor element 110 is in the on-state from the time t1 to the time t3 and is in the off-state for the time period until the time t1 and the time period after the time t3.

The collector current Ic of the power semiconductor element 110 is substantially zero (off) until the control signal Vin exceeds the threshold value Vthin of the detector 132a, flows (on) when the control signal Vin is at a potential exceeding the threshold value Vthin of the detector 132a, and has a maximal value of (Vb−Vbi)/(R1+Ron). "Vb" is a constant voltage supplied by the power source 40. "Vbi" is an internal potential of the power semiconductor element 110. "R1" is the resistance of the primary coil 32. "Ron" is the on-resistance of the power semiconductor element 110. The temporal variation dIc/dt of the collector current Ic is determined corresponding to the inductance of the primary coil 32 and the supply voltage of the power source 40 and is increased up to the predetermined (or preset) current value.

In the semiconductor device 100 depicted in FIG. 5, the power semiconductor element 110 is turned on at the time t1 and the collector current Ic gradually increases. The end-to-end voltage Vw of the wire 180 also increases associated with the increase of the collector current Ic. The end-to-end voltage Vw of the wire 180 is determined by the resistance Rw of the wire 180 and the collector current Ic, and is Vw=Rw×Ic. When the collector current reaches its maximum at a time t2, the collector current Ic maintains a constant value and, when the control signal Vin becomes 0 V at the time t3, the power semiconductor element 110 is turned off.

Similarly to FIG. 6A, FIG. 6B depicts an example where the control signal Vin input into the control terminal 102 rises from 0 V to a voltage that exceeds the threshold value Vthin of the detector 132a at the time t1 and thereafter, falls from the voltage that exceeds the threshold value Vthin to 0 V at the time t3.

FIG. 6B differs from FIG. 6A in that the control signal Vin is low from the time t1 to the time t3. As a result, the difference Vin−Vw between the control signal Vin and the end-to-end voltage Vw of the wire 180 is equal to or smaller than the threshold value Vthin of the detector 132a at the time t2, and the power semiconductor element 110 is turned off. As a result, the end-to-end voltage Vw of the wire 180 is 0 V and the power semiconductor element 110 is again turned on and, at a time t2b, the phenomenon occurring at a time t2a is repeated.

Figure 7:
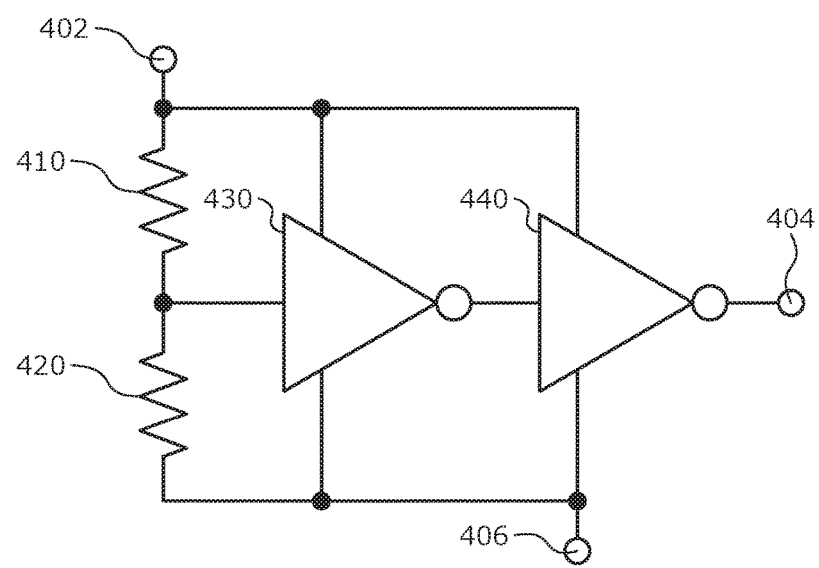
FIG. 7 is a diagram of an example of a configuration of a detector of the semiconductor device according to the conventional technique.

Details of the operation of the turning off of the power semiconductor element 110 will be described. FIG. 7 is a diagram of an example of the configuration of the detector 132a of the semiconductor device 100 according to the conventional technique. The detector 132a includes a control signal input unit 402, a detection signal output unit 404, a reference potential input unit 406, a resistor 410, a resistor 420, an inverter 430, and an inverter 440.

The control signal input unit 402 receives input of the control signal from the control terminal 102. The detector 132a operates using this control signal as a power source. The detection signal output unit 404 outputs the result of the detection by the detector 132a. For example, the detection signal output unit 404 is connected to the signal output unit 134 and outputs the potential of the same logic as that of the control signal as the result of the detection of the control signal. The reference potential input unit 406 is connected to the reference potential.

The resistor 410 and the resistor 420 are connected in series between the control signal input unit 402 and the reference potential input unit 406, and divide the voltage of control signal Vin input from the control signal input unit 402. The divided potential is as follows, where, the resistance value of the resistor 410 is "R1" and the resistance value of the resistor 420 is "R2".

$$\text{Vin} \times R2/(R1+R2) \tag{1}$$

For example, when the control signal transitionally rises linearly from the off-potential (e.g., 0 V) to the on-potential (e.g., 5 V), the divided potential also linearly rises from 0 V to 5×R2/(R1+R2).

The input terminal of the inverter 430 is connected between the resistor 410 and the resistor 420. The inverter 430 receives the divided potential and outputs from the output terminal thereof, a signal formed by inverting the logic. The inverter 440 receives the output of the inverter 430, and inverts and outputs the received output. The divided potential of the threshold value Vthin of the detector 132a is a threshold value Vthinv of the inverter 430 and Vthinv is Vthinv=Vthin×R2/(R1+R2).

When the power semiconductor element 110 is in the on-state and the end-to-end voltage Vw of the wire 180 is generated, the difference in the potential between the divided potential input into the inverter 430 and a reference potential 406 is (Vin−Vw)×R2/(R1+R2) and is smaller than that in a case where the power semiconductor element 110 is in the off-state. As a result, after the power semiconductor element 110 is turned on, in a case where the end-to-end voltage Vw of the wire 180 is generated and (Vin−Vw)×R2/(R1+R2) becomes smaller than Vthinv, the power semiconductor element 110 is turned off even when the control signal Vin is higher than the threshold value Vthin of the detector 132a.

As described, it may be seen for the semiconductor device 100 that, in a case where the difference between the control signal Vin and the threshold value Vthin of the detector 132a is small and the collector current Ic is large, even when the control signal Vin satisfies the condition for conduction, the power semiconductor element 110 may be turned off. In this case, although the ignition needs to originally be executed at the time t3, the ignition is also executed at the time t2a and the time t2b and as a result, a defect and the like may be caused even in the internal combustion engine.

Preferred embodiments of a semiconductor device according to the present invention will be described in detail below with reference to the accompanying drawings. The scope of the invention according to the appended claims is not limited to the following embodiments. All the combinations of the features described in the embodiments are not necessarily essential for the invention.

Figure 1:
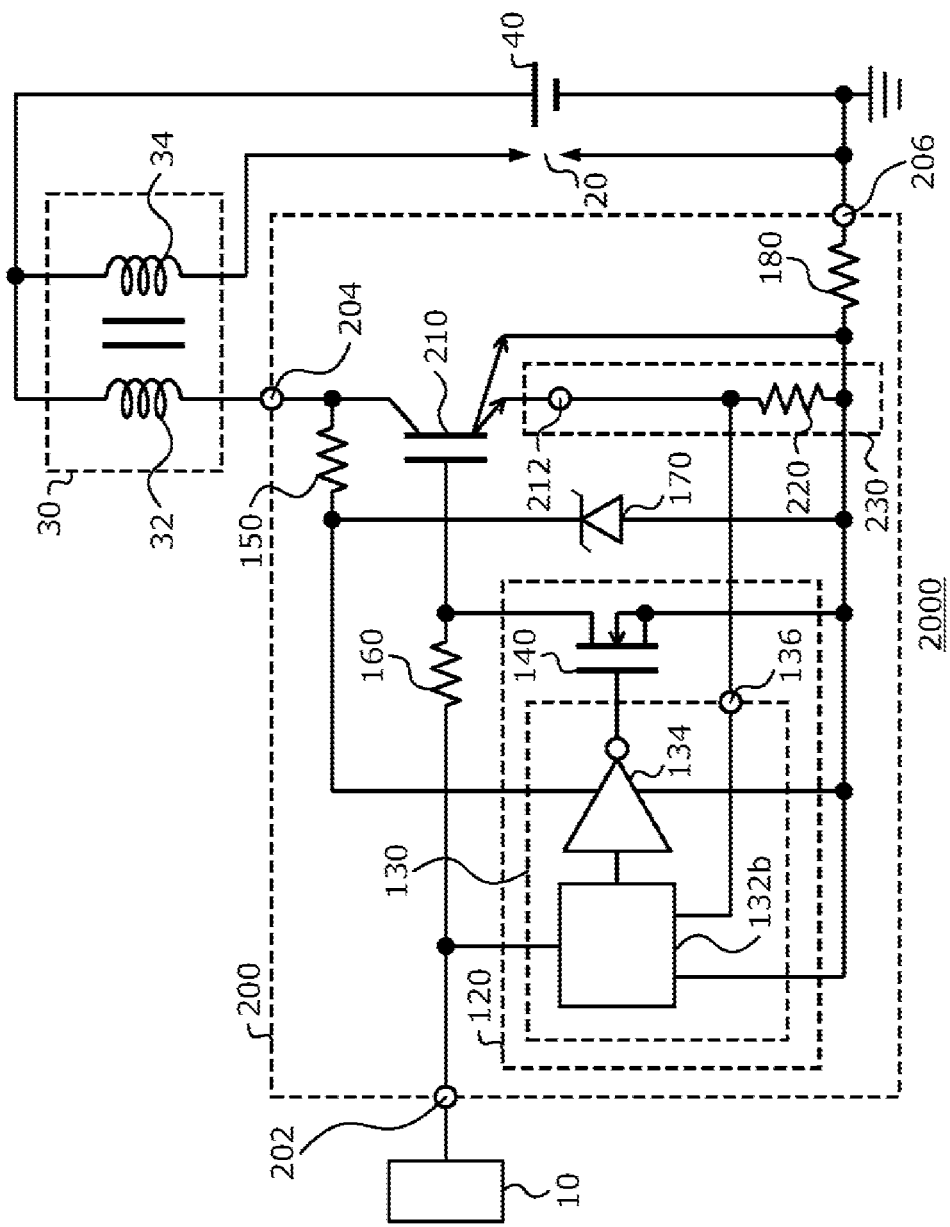
FIG. 1 is a diagram of an example of a configuration of an igniter according to a first embodiment.

FIG. 1 is a diagram of an example of the configuration of an igniter 2000 according to a first embodiment. In the igniter 2000 depicted in FIG. 1, operations substantially same as those of the igniter 1000 according to the conventional technique depicted in FIG. 5 are given the same reference numerals and will not again be described. The igniter 2000 includes a semiconductor device 200. The control signal generator 10, the spark plug 20, the ignition coil 30, and the power source 40 included in the igniter 2000 will not again be described.

The semiconductor device 200 includes a control terminal 202, a first terminal 204, a second terminal 206, a power semiconductor element 210, the first gate controller 120, the resistor 150, the resistor 160, the Zener diode 170, the wire 180, a first sensing terminal 212, and a resistor 220.

The control terminal 202 is input with a control signal to control the power semiconductor element 210. The control terminal 202 is connected to the control signal generator 10 and receives the control signal. The first terminal 204 is connected to the power source 40 through the ignition coil 30. The second terminal 206 is connected to the reference potential. The first terminal 204 is a terminal on a high potential side as compared to the second terminal 206 and the second terminal 206 is a terminal on a low potential side as compared to the first terminal 204.

The resistor 150, the resistor 160, the Zener diode 170, and the wire 180 are substantially same as those described with reference to FIG. 5 and therefore, will not again be described.

The power semiconductor element 210 includes the first sensing terminal 212 that outputs a sensing current Isns that is proportional to the collector current Ic of the power semiconductor element 210.

The resistor 220 is connected between the first sensing terminal 212 and the emitter terminal of the power semiconductor element 210, and generates a sensing voltage Vsns that is proportional to the sensing current Isns. The resistor 220 and the first sensing terminal 212 constitute a current detector 230 that detects the collector current value of the power semiconductor element 210.

A turn-off condition detector 130 includes a detector 132b, the signal output unit 134, and an input terminal 136 that is connected to the first sensing terminal 212.

Similar to the semiconductor device 100 described with reference to FIG. 5, in the semiconductor device 200 according to the first embodiment, the power semiconductor element 210 is in the on-state when the potential of the control signal becomes high. As described with reference to FIG. 5, the igniter 2000 may thereby cause the spark plug 20 to discharge to ignite the combustion gas.

In the first embodiment, when the collector current Ic is increased and the end-to-end voltage Vw of the wire 180 is increased, the sensing voltage Vsns proportional to the end-to-end voltage Vw of the wire 180 is input into the input terminal 136 of the turn-off condition detector 130 to prevent malfunction of the turn-off condition detector 130. Details of the components of the igniter 2000 will be described.

Figure 2:
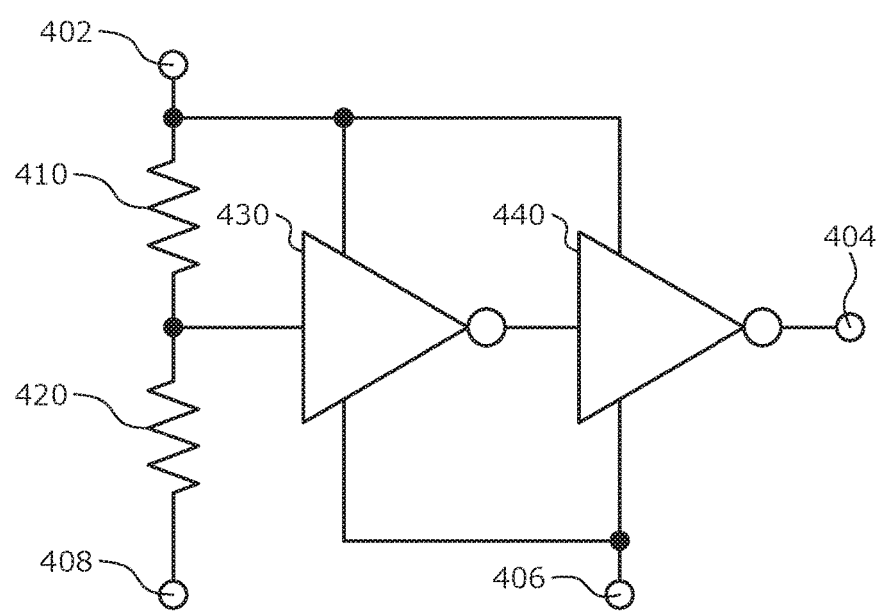
FIG. 2 is a diagram of an example of a configuration of a detector according to a semiconductor device of the first embodiment.

FIG. 2 is a diagram of an example of the configuration of the detector 132b according to the semiconductor device 200 of the first embodiment. The detector 132b includes the control signal input unit 402, the detection signal output unit 404, the reference potential input unit 406, a sense input terminal 408, the resistor 410, the resistor 420, the inverter 430, and the inverter 440.

Compared to the detector 132a of the conventional technique, the detector 132b connects the terminal connected to the reference potential input unit 406 of the resistor 220, to the sense potential input unit 408.

Until the time when the potential of the control signal Vin varies from the off-potential to an on-potential, the operation of the semiconductor device 200 is same as that of the semiconductor device 100 because the end-to-end voltage Vw of the wire 180 and the sensing voltage Vsns are 0 V.

When the power semiconductor element 210 is in the on-state and the end-to-end voltage Vw of the wire 180 and the sensing voltage Vsns are generated, the difference Vininv−Vw between the divided potential input into the inverter 430 and the potential of the reference potential input unit 406 is as follows.

$$Vininv-Vw=(Vin-Vw-Vsns)\times R2/(R1+R2)+Vsns \quad (2)$$

When the end-to-end voltage Vw of the wire 180 and the sensing voltage Vsns are further replaced with the sensing current Isns, the resistance value Rsns of the resistor 220, the collector current Ic, and the wire resistance Rw, equation 2 is transcribed as follows.

$$Vininv-Vw=(Vin-Ic\times Rw-Isns\times Rsns)\times R2/(R1+R2)+Isns\times Rsns \quad (3)$$

It is assumed for the above that R1+R2 is sufficiently greater than the resistance value Rsns of the resistor 220 (for example, a 10,000-fold value) and the current flowing from the sense potential input unit 408 to the resistor 220 is negligible.

In this case, the condition for the potential difference Vininv−Vw between the divided potential and the potential of the reference potential input unit 406 not to be varied even when the power semiconductor element 210 is in the on-state, is that Vininv−Vw does not depend on the collector current Ic. The condition for this is that the divided potential Vin×R2/(R1+R2) divided by the resistor 410 and the resistor 420 and (Eq. 3) are equal to each other. Using the ratio Ic/Isns of the collector current Ic to the sensing current Isns that is Ic/Isns=A, the resistance value Rsns of the resistor 220 is as follows.

$$Rsns=A\times Rw\times R2/(R1+R2)/\{1-R2/(R1+R2)\} \quad (4)$$

For example, when the wire resistance Rw is Rw=5 mΩ, R1+R2 is R1+R2=100 kΩ, and Ic/Isns is Ic/Isns=1,000, the resistance value Rsns of the resistor 220 is Rsns=5 Ω.

Figure 3:
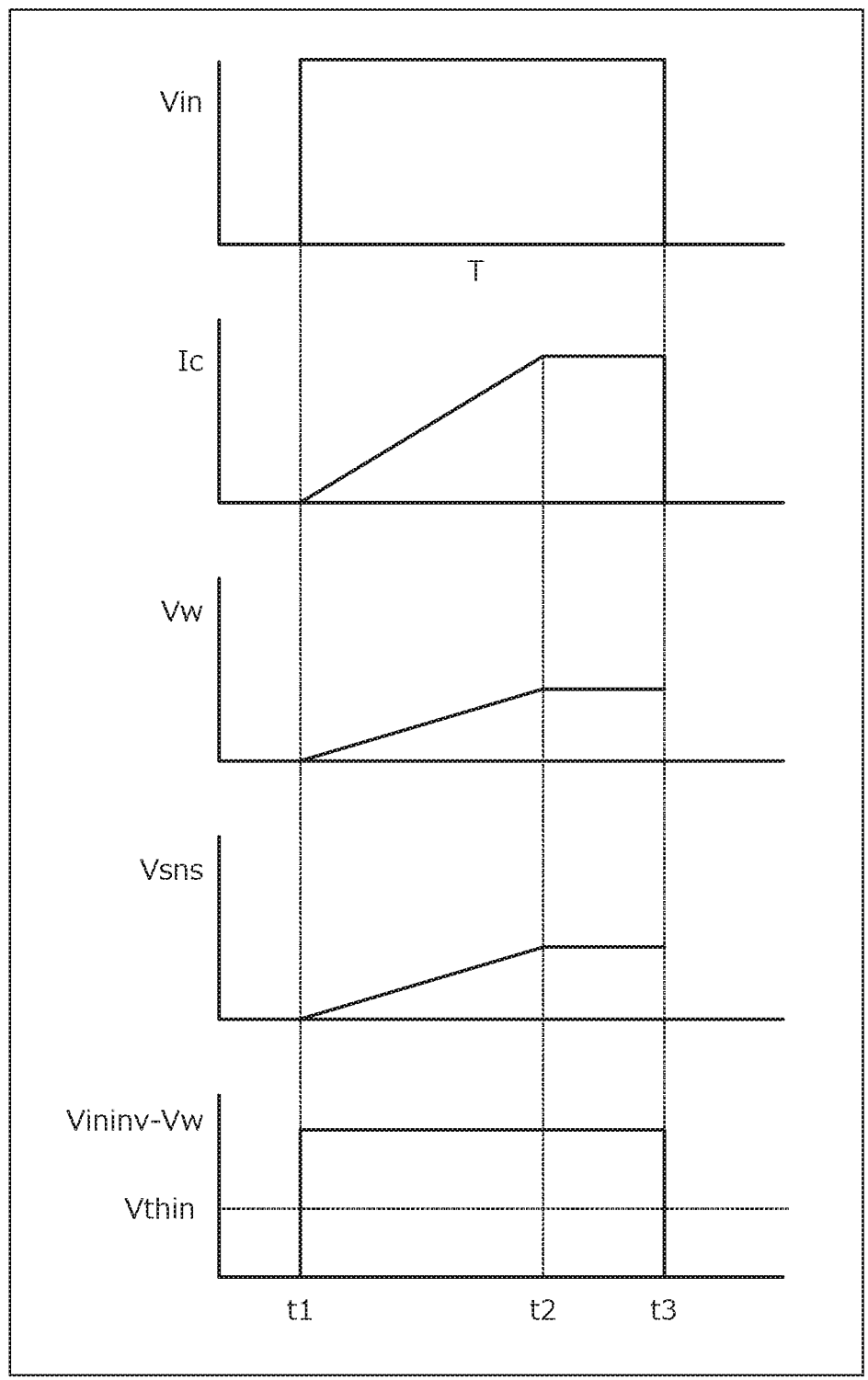
FIG. 3 is a diagram of an example of operation waveforms of components of the semiconductor device according to the first embodiment.

FIG. 3 is a diagram of an example of operation waveforms of the components of the semiconductor device 200 according to the first embodiment. In FIG. 3, the axis of abscissa represents the time and the axis of ordinate represents the voltage value or the current value. Representing the control signal input from the control terminal 202 as "Vin", the current between the collector and the emitter of the power semiconductor element 210 (referred to as "collector current") as "Ic", the end-to-end voltage of the wire 180 as "Vw", the end-to-end voltage of the resistor 220 as "Vsns", and the potential difference between the potential Vininv input into the inverter 430 of the detector 132b and the potential of the reference potential input unit 406 as "Vininv−Vw", FIG. 3 depicts the temporal waveforms thereof.

FIG. 3 depicts an example where the control signal Vin input into the control terminal 202 rises from 0 V to a voltage that exceeds the threshold value Vthin of the detector 132b at the time t1 and thereafter, falls from the voltage that exceeds the threshold value Vthin to 0 V at the time t3. In the example in FIG. 3, the power semiconductor element 210 is in the on-state from the time t1 to the time t3 and is in the off-state for the time period until the time t1 and the time period after the time t3.

The collector current Ic of the power semiconductor element 210 is substantially zero (off) until the control signal Vin exceeds the threshold value Vthin of the detector 132b, flows (on) when the control signal Vin is at a potential exceeding the threshold value Vthin of the detector 132b, and has the maximal value of (Vb−Vbi)/(R1+Ron). "Vb" is a constant voltage supplied by the power source 40. "Vbi" is an internal potential of the power semiconductor element 210. "R1" is the resistance of the primary coil 32. "Ron" is the on-resistance of the power semiconductor element 210. The temporal variation dIc/dt of the collector current Ic is determined corresponding to the inductance of the primary coil 32 and the supply voltage of the power source 40, and is increased up to the predetermined (or preset) current value.

In the semiconductor device 200 depicted in FIG. 1, the power semiconductor element 210 is turned on at the time t1 and the collector current Ic gradually increases. The end-to-end voltage Vw of the wire 180 also increases associated with the increase of the collector current Ic. The end-to-end voltage Vw of the wire 180 is determined by the resistance Rw of the wire 180 and the collector current Ic, and Vw is Vw=Rw×Ic. The sensing voltage Vsns to be the end-to-end voltage of the resistor 220 is also increased by the sensing current Isns that is proportional to the collector current IC.

When the collector current Ic reaches its maximum at the time t2, the collector current Ic maintains a constant value and, when the control signal Vin becomes 0 V at the time t3, the power semiconductor element 210 turns off.

During the time period from the time t1 to t3, the condition for the semiconductor device 200 to be turned on is that the difference Vininv−Vw between the potential Vininv input into the inverter 430 of the detector 132b and the potential of the reference potential input unit 406 is greater than the threshold value Vthin of the detector 132b.

The dependence of Vininv−Vw on the collector current Ic may be eliminated by defining the resistance value Rsns of the resistor 220 by equation 4. As a result, Vininv−Vw may be set to be greater than Vthin, and turning off of the power semiconductor element 210 may be prevented.

As described, according to the semiconductor device of the first embodiment, the semiconductor device includes the first sensing terminal that outputs the sensing current that is proportional to the collector current and the first sensing terminal generates the sensing voltage proportional to the sensing current. As a result, even when the power semiconductor element is in the on-state, variation of the potential difference between the divided potential and the potential of the reference potential input unit may be prevented. As a result, for the semiconductor device 200, the turn-off condition of the turn-off condition detector is not changed and malfunction may be prevented even when the control signal is switched from off to on and the collector current of the power semiconductor element flows.

Figure 4:
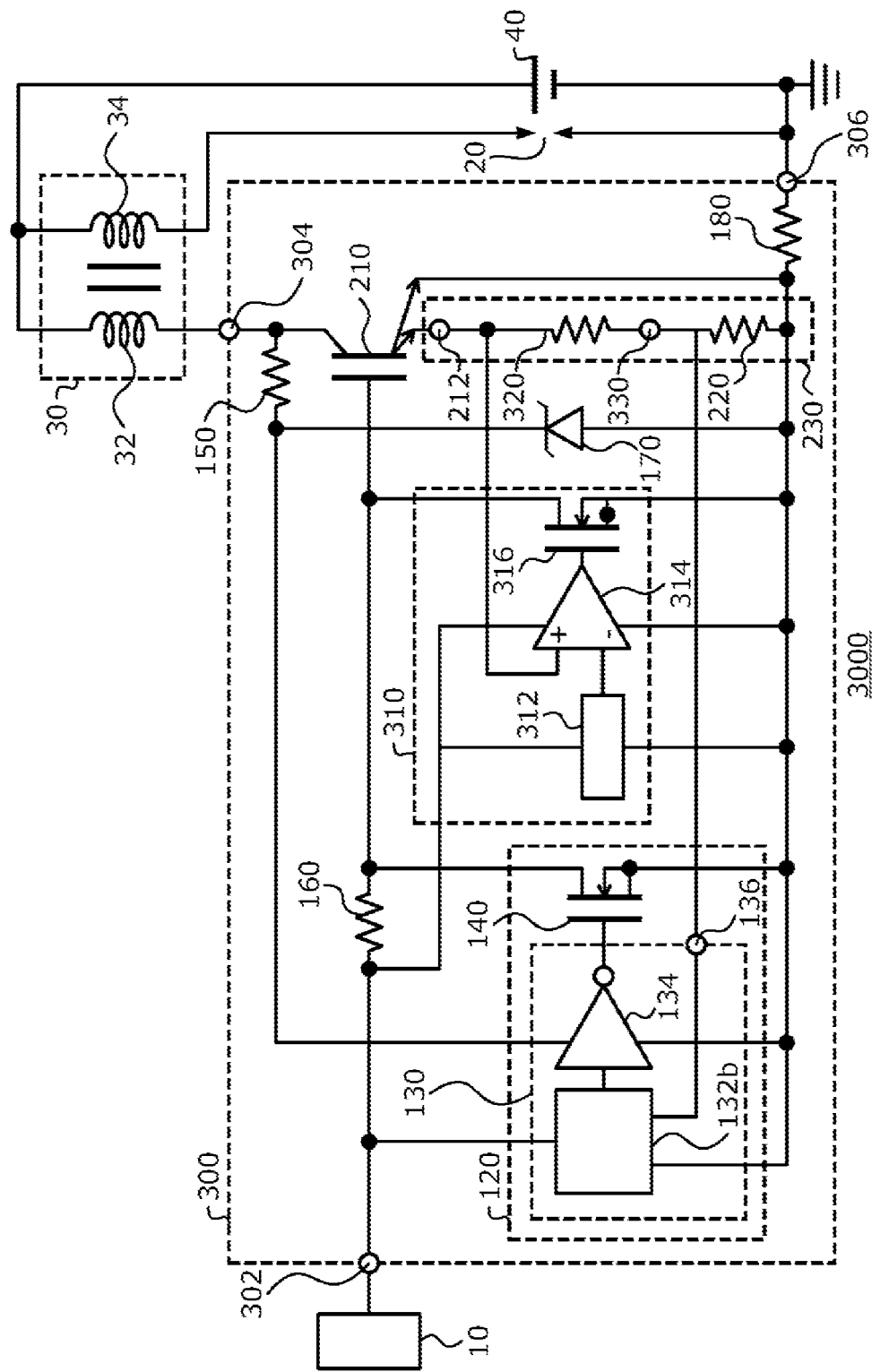
FIG. 4 is a diagram of an example of a configuration of an igniter according to a second embodiment.

FIG. 4 is a diagram of an example of the configuration of an igniter 3000 according to a second embodiment. In the igniter 3000 depicted in FIG. 4, operations substantially same as those of the igniter 2000 according to the first embodiment depicted in FIG. 1 are given the same reference numerals and will not again be described. The igniter 3000 includes a semiconductor device 300. The control signal generator 10, the spark plug 20, the ignition coil 30, and the power source 40 included in the igniter 3000 will not again be described.

The semiconductor device 300 includes a control terminal 302, a first terminal 304, a second terminal 306, the power semiconductor element 210, the first gate controller 120, a second gate controller 310, the resistor 150, the resistor 160, the Zener diode 170, the wire 180, the first sensing terminal 212, the resistor 220, a resistor 320, and a second sensing terminal 330.

The control terminal 302 receives input of a control signal to control the power semiconductor element 210. The control terminal 302 is connected to the control signal generator 10 and receives a control signal. The first terminal 304 is connected to the power source 40 through the ignition coil 30. The second terminal 306 is connected to the reference potential. The first terminal 304 is a terminal on a high potential side as compared to the second terminal 306 and the second terminal 306 is a terminal on a low potential side as compared to the first terminal 304.

The first gate controller 120, the resistor 150, the resistor 160, the Zener diode 170, the wire 180, the power semiconductor element 210, and the resistor 220 have been described with reference to FIG. 1 and FIG. 5, and will not again be described.

The resistor 320 is connected between the first sensing terminal 212 and the resistor 220, and includes the second sensing terminal 330 on the side connected to the resistor 220. The resistor 320 outputs the sensing voltage Vsns corresponding to the sensing current Isns to send the sensing voltage Vsns to the second gate controller 310.

The second gate controller 310 detects whether the sense potential Vsns satisfies the turn-off condition, and controls the gate of the power semiconductor element 210. The second gate controller 310 may detect whether the sensing current Isns satisfies the turn-off condition, using a predetermined threshold. The second gate controller 310 includes a threshold value output unit 312, a comparing unit 314, and a second switching element 316.

The threshold value output unit 312 outputs a threshold value potential Vref determined in advance. The threshold value output unit 312 outputs, for example, the threshold value potential corresponding to a permissible value of the amount of the current flowing through the resistor 320. The threshold value output unit 312 may be configured by a combination of a constant-current circuit, a resistor, and the like, or may be configured by a combination of a Zener diode, a resistor, and the like.

The comparing unit 314 compares the result of the detection by the resistor 320, and the threshold value potential Vref determined in advance and output by the threshold value output unit 312 with each other. For example, the comparing unit 314 outputs a high potential as the result of the comparison since the sensing potential Vsns output by the resistor 320 exceeds the threshold value potential Vref, and outputs a low potential as the result of the comparison when the detected potential Vsns is equal to or lower than the threshold value potential Vref. The comparing unit 314 includes, for example, a comparator and the like.

The second switching element 316 is connected between the gate and the emitter of the power semiconductor element 210 and controls the gate potential of the power semiconductor element 210 according to the result of the comparison by the comparing unit 314. For example, the second switching element 316 reduces the electrical resistance between the drain terminal connected to the gate of the power semiconductor element 210 and the source terminal connected to the emitter since the result of the comparison by the comparing unit 314 is the high potential. When the detected potential Vsns of the resistor 320 exceeds the threshold value Vref, the second switching element 316 adjusts the gate potential of the power semiconductor element 210 such that the detected potential Vsns maintains the threshold value Vref.

On the other hand, when the result of the comparison by the comparing unit 314 is the low potential, the second switching element 316 disconnects the electrical connection between the gate and the emitter of the power semiconductor element 210. The potential according to the control signal input from the control terminal 302 is, therefore, supplied to the gate of the power semiconductor element 210 through the resistor 160. The second switching element 316 is, for example, a normally-off switching element and may be an n-channel MOSFET.

The second sensing terminal 330 is connected to the input terminal 136, executes the same operation as that of the first sensing terminal 212 of the semiconductor device 200 depicted in FIG. 1, and prevents malfunction of the first gate controller 120. The resistor 220, the first sensing terminal 212, the resistor 320, and the second sensing terminal 330 constitute the current detector 230 that detects the collector current value of the power semiconductor element 210.

As described, according to the semiconductor device of the second embodiment, effects similar to those of the first embodiment are achieved. The semiconductor device according to the second embodiment includes the second gate controller that controls the gate current of the power semiconductor element according to the collector current of the power semiconductor element. As a result, the semiconductor device according to the second embodiment limits the collector current of the power semiconductor element to a current value equal to or lower than the threshold value and prevents excessive current from flowing. The semiconductor device also prevents malfunction of the first gate controller. These two defect-preventing functions may suppress increases of the circuit area by utilizing the sensing current commonly supplied from the first sensing terminal.

Although the present invention has been described with reference to the embodiments, the technical scope of the present invention is not limited to the scope described in the embodiments. It is apparent for those skilled in the art that a broad range of changes and improvements may be made to the embodiments. It is obvious from the description of the appended claims that the embodiments each having such changes and improvements made thereto may also be included in the technical scope of the present invention. It should be noted that the execution order of the processes such as operations, procedures, steps, and stages in the devices, systems, programs, and methods described or depicted in the appended claims, the specification, and the drawings may be realized in arbitrary order as far as "before", "prior to", and the like are not clearly specified especially or an output of a preceding process is not used in a succeeding process. For the operation flows in the appended claims, the specification, and the drawings, even when the description is made using "first", "next", and the like for convenience, this does not mean that it is essential to execute each of the operation flows in this order.

According to an embodiment, the semiconductor device includes a first sensing terminal configured to output a sensing current that is proportional to the collector current and generates a sensing voltage that is proportional to the sensing current. Thus, variation may be avoided for the difference between the divided potential and the potential of the reference potential input unit, even when the power semiconductor element is in the on-state. As a result, in the semiconductor device, the turn-off condition of the turn-off condition detector is not changed and malfunction may be prevented even when the control signal is switched from off to on and the collector current of the power semiconductor element flows.

The semiconductor device further includes a second gate controller that controls the gate current of the power semiconductor element according to the collector current of the power semiconductor element. The semiconductor device thereby limits the value of the collector current of the power semiconductor element to a current value equal to or smaller than the threshold value to prevent excessive current from flowing. The semiconductor device also prevents malfunction of the first gate controller. These two defect-prevention functions may suppress increases of the circuit area by utilizing the sensing current commonly supplied from the first sensing terminal.

According to the semiconductor device of the present invention, an effect is achieved in that malfunction is prevented by reliably causing the power semiconductor element to be conductive when a control signal to cause the power semiconductor device to be conductive is input to the semiconductor device.

As described, the semiconductor device according to the present invention is useful for a semiconductor device that has a power semiconductor element and a control circuit therefor integrated on a single chip, and is especially suitable for a switching semiconductor element for an automobile igniter.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device comprising:
   a power semiconductor element connected between a first terminal on a high potential side and a second terminal on a low potential side, the power semiconductor element controlled to turn on or off corresponding to a gate potential;
   a current detector configured to detect a collector current value of the power semiconductor element;
   a turn-off condition detector configured to detect whether a control signal input from a control terminal and controlling the power semiconductor element satisfies a predetermined turn-off condition; and
   a first switching element configured to control the gate potential of the power semiconductor element to be an off-potential when the turn-off condition detector detects that the turn-off condition is satisfied, wherein
   the turn-off condition detector includes an input terminal connected to the current detector and uses the control signal and the collector current value as the turn-off condition.

2. The semiconductor device according to claim 1, wherein
   the turn-off condition detector includes:
      a detector configured to detect whether the control signal exceeds a predetermined threshold; and
      an inverter configured to output a first switching element control signal to control the first switching element according to a detection result obtained by the detector.

3. The semiconductor device according to claim 1, wherein
   the first switching element electrically connects a gate and an emitter of the power semiconductor element to each other to set the gate of the power semiconductor element to be at an off-potential.

4. The semiconductor device according to claim 1, further comprising
   a second gate controller configured to control a gate current of the power semiconductor element, according to the collector current of the power semiconductor element.

5. The semiconductor device according to claim 1, wherein
   the power semiconductor element is one of an IGBT or a vertical MOSFET.

6. The semiconductor device according to claim 1, wherein
   the semiconductor device is an igniter configured to control, according to an external control signal, current flowing through an ignition coil.

* * * * *